(12) United States Patent
Herrmann et al.

(10) Patent No.: US 11,942,572 B2
(45) Date of Patent: Mar. 26, 2024

(54) OPTICAL CHIPS MOUNTED ON A DEFORMED CARRIER

(71) Applicant: OSRAM OLED GMBH, Regensburg (DE)

(72) Inventors: Siegfried Herrmann, Neukirchen (DE); Michael Völkl, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 883 days.

(21) Appl. No.: 16/768,594

(22) PCT Filed: Dec. 13, 2018

(86) PCT No.: PCT/EP2018/084804
§ 371 (c)(1),
(2) Date: May 29, 2020

(87) PCT Pub. No.: WO2019/115713
PCT Pub. Date: Jun. 20, 2019

(65) Prior Publication Data
US 2021/0091263 A1  Mar. 25, 2021

(30) Foreign Application Priority Data
Dec. 14, 2017 (DE) .................. 10 2017 129 975.0

(51) Int. Cl.
*H01L 33/20* (2010.01)
*F21K 9/90* (2016.01)
(Continued)

(52) U.S. Cl.
CPC .............. *H01L 33/20* (2013.01); *F21K 9/90* (2013.01); *H01L 24/97* (2013.01);
(Continued)

(58) Field of Classification Search
CPC . H01L 2924/181; H01L 24/97; H01L 25/167; H01L 33/644; H01L 33/20;
(Continued)

(56) References Cited

U.S. PATENT DOCUMENTS 7,675,073 B2 * 3/2010 Moyer ................ G06F 3/03543
257/E31.095
2008/0283847 A1 * 11/2008 Moyer ................ G06F 3/03543
257/E31.095
(Continued)

FOREIGN PATENT DOCUMENTS

DE  112015004330 T5  6/2017
DE  102016105313 A1  9/2017
(Continued)

OTHER PUBLICATIONS

International Search Report issued in corresponding International Application No. PCT/EP2018/084804 dated Mar. 13, 2019.

*Primary Examiner* — Alonzo Chambliss
(74) *Attorney, Agent, or Firm* — ArentFox Schiff LLP

(57) ABSTRACT

The invention relates to a method for producing a semiconductor component comprising a radiation-emitting optical semiconductor chip or a plurality of radiation-emitting optical semiconductor chips, said method comprising: applying the radiation-emitting optical semiconductor chip or the plurality of radiation-emitting optical semiconductor chips to a deformable flat support deforming the support; and permanently fixing the deformation.

18 Claims, 17 Drawing Sheets

(51) Int. Cl.
*H01L 23/00* (2006.01)
*H01L 25/075* (2006.01)
*H01L 33/52* (2010.01)
*H01L 33/64* (2010.01)
*H05K 1/05* (2006.01)
*H05K 3/00* (2006.01)
*H05K 3/28* (2006.01)
*H10K 19/00* (2023.01)
*H10K 50/10* (2023.01)
*F21Y 115/10* (2016.01)

(52) U.S. Cl.
CPC .......... *H01L 25/0753* (2013.01); *H01L 33/52* (2013.01); *H01L 33/64* (2013.01); *H01L 33/644* (2013.01); *H05K 1/05* (2013.01); *H05K 3/0014* (2013.01); *H05K 3/284* (2013.01); *H10K 19/901* (2023.02); *H10K 50/10* (2023.02); *F21Y 2115/10* (2016.08); *H01L 2924/181* (2013.01); *H05K 2201/0129* (2013.01); *H05K 2201/10106* (2013.01)

(58) Field of Classification Search
CPC ..... H01L 33/52; H01L 33/64; H01L 25/0753; H05K 1/05; H05K 3/0014; H05K 3/284; F21K 9/90; H10K 19/901; H10K 50/10
See application file for complete search history.

(56) References Cited

U.S. PATENT DOCUMENTS

| | | | |
|---|---|---|---|
| 2010/0157595 A1* | 6/2010 | Lin | F21K 9/00 362/249.02 |
| 2011/0111539 A1 | 5/2011 | Lai et al. | |
| 2012/0250326 A1* | 10/2012 | Sekine | H01L 25/0753 362/418 |
| 2014/0145590 A1 | 5/2014 | Sakai et al. | |
| 2016/0316570 A1 | 10/2016 | De Vaan et al. | |

FOREIGN PATENT DOCUMENTS

| | | |
|---|---|---|
| EP | 2669946 A2 | 12/2013 |
| EP | 3094161 A1 | 11/2016 |
| JP | 2013149431 A | 8/2013 |
| WO | 2015139581 A2 | 9/2015 |

* cited by examiner

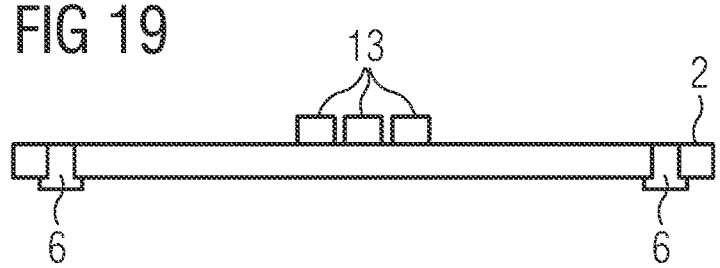
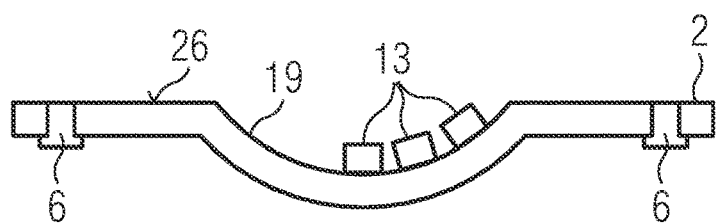
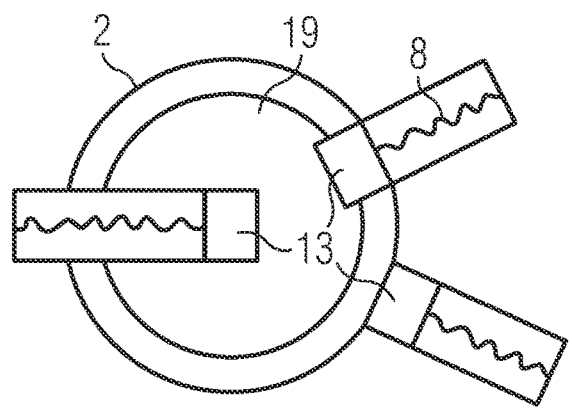
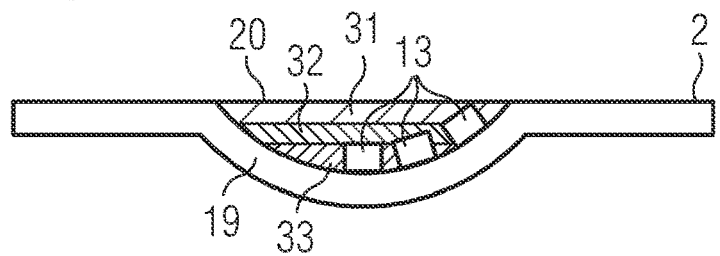

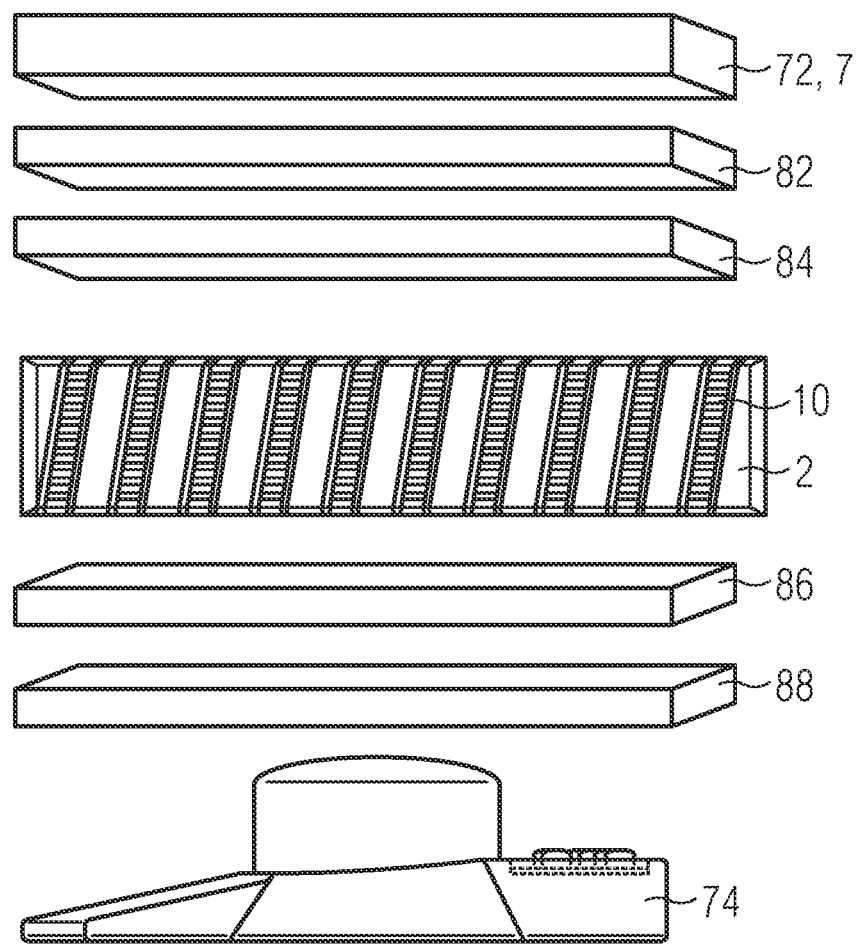

OPTICAL CHIPS MOUNTED ON A DEFORMED CARRIER

CROSS REFERENCE TO RELATED APPLICATIONS

This application is a 35 U.S.C. § 371 National Phase of PCT Application No. PCT/EP2018/084804 filed Dec. 13, 2018, entitled "METHOD FOR PRODUCING A SEMICONDUCTOR COMPONENT, AND SEMICONDUCTOR COMPONENT," which claims priority to German patent application 1C2017129975.0 filed Dec. 14, 2017, the entire contents of each of which are hereby incorporated by reference.

BACKGROUND

The invention relates to a method for producing a semiconductor component comprising one or more radiation-emitting optical semiconductor chips, and to such a semiconductor component.

Conventionally mounted radiation-emitting optical semiconductor chips, also referred to as LED chips, are applied on a planar carrier, such that their base side faces the carrier. The basic area of such a component comprising three chips can be 3 mm×3 mm, for example. Approaches that allow more degrees of freedom in the arrangement of the optical semiconductor chips are carriers having semiconductor chips set up, such that the semiconductor chips are placed in an angular fashion on the carrier. A further approach is flexible carrier films, so-called "flexible electronics" films. In the case of MID3 technology, semiconductor chips are applied on a three-dimensional carrier which can be shaped in almost any manner desired.

SUMMARY

Guided by the object of providing an alternative solution, a method for producing a semiconductor component and a semiconductor component producible thereby are specified.

The method for producing a semiconductor component comprising one radiation-emitting optical semiconductor chip or a plurality of radiation-emitting optical semiconductor chips comprises applying the radiation-emitting optical semiconductor chip or the plurality of radiation-emitting optical semiconductor chips on a deformable flat carrier, deforming the carrier and permanently fixing the deformation.

Flexible conductor tracks are applied on the deformable substrate. The carrier, also referred to as substrate, is populated with the semiconductor chips in a conventional standard method, and it acquires its target shape only after population, said target shape then being fixed, or—figuratively speaking—"frozen", in various ways. This method enables a spatially flexible arrangement of radiation-emitting semiconductor chips, also referred to as LED chips. The semiconductor component produced as a result has a reduced basic area in comparison with conventional semiconductor components comprising radiation-emitting semiconductor chips. The emission characteristic can be adapted to different applications with a lower outlay than in conventional methods for the angular mounting of the chips, which require a high, in particular mounting, outlay.

The semiconductor component is one mechanical unit that can be joined together from a plurality of elements. On the carrier, an electronic circuit and/or conductor structures are/is applied and contact means for driving the radiation-emitting optical semiconductor chips are provided. In one embodiment, the semiconductor chips are embedded in a deformable plastics film.

The radiation-emitting semiconductor chip can be for example an LED chip having an active, light-emitting region on a semiconductor substrate.

In one embodiment of the method, a thermoplastic deformation of the carrier is effected, which maintains its deformation after cooling. Deformation and fixing go hand in hand in this way. The thermoplastic deformation enables total freedom of shape in the arrangement of the semiconductor chips in space, by virtue of the carrier being deformed in such a way that the chips positioned thereon are brought to their desired position. Owing to possible population by standard methods before the deformation, the method is cost-effective in comparison with MID3d technology. The semiconductor chip or the plurality of semiconductor chips on the carrier can subsequently be enclosed by molding in order to protect them and to influence the emission characteristic further. In combination with a suitable sensor system, this opens up a multiplicity of application possibilities.

In one embodiment of the method, the deformation of the carrier is effected by thermoforming by means of compressed air and/or vacuum or by means of a press. In this way, it is possible to produce even larger semiconductor components with modular character, for example having the function of a display and control element. The fixing of the deformation can be effected by cooling of the carrier or by the deformed carrier being encapsulated with a plastics layer.

Alternatively, the carrier can be deformed by bending or curving by way of a shaping part and the bent or curved carrier can then be casted in order to fix the deformation. The deformation can be supported by pressure and/or temperature. During the deformation, the carrier can be moved toward the shaping part and/or the shaping part is moved toward the carrier in a manner similar to a stamp. The shaping part is advantageously a three-dimensional structured shaping part. Examples thereof are cone, pyramid, truncated cone and truncated pyramid. Such a shaping part can have a wedge-shaped shape. The semiconductor chip or the plurality of semiconductor chips is/are enclosed by molding on the carrier by means of the casting. Such a carrier is advantageously a flexible film. The shaping part can be a tool or remain in the semiconductor component. In one embodiment, the shaping part is removed after casting and the resultant cavity is filled. Alternatively, the shaping part remains as a permanent shape in the semiconductor component. Such a shaping part can perform optical functions, for example can be a metal reflector or act as a lens.

The production method can provide for introducing cutouts into the carrier. The cutouts can be introduced into the flat carrier before or after population by means of customary separation methods, for example stamping or material separation by laser treatment. Alternatively, the cutouts can be brought about in a targeted manner by the mechanical deformation, for example at locations with material weakening. Such predetermined breaking locations, for example in the form of thinner film regions, in the carrier tear open during deformation, thus giving rise to holes in the carrier during the deformation process. The cutouts expose regions of the shaping part. However, in this way it is possible to form not only cutouts but also transparent regions. In the last-mentioned case, the deformation has the effect that the carrier film becomes thinner and thus transparent or at least more transparent. Consequently, the deformation step makes it possible to open regions of the carrier or to deform transparent regions.

At the cutouts, after the deformation by means of a shaping part, the latter is not completely covered by the carrier, such that the accessible region of the surface of the shaping part at the cutout locations can interact with the emitted light from the semiconductor chips. The shaping part can serve as a reflector, for example, or it has other advantageous properties which make an optical contribution to the system.

The carrier with the semiconductor chips is singulated to form semiconductor components after the deformation has been fixed. The singulation in a final step allows the efficient parallel production of a multiplicity of semiconductor components in an assemblage.

In the case of the semiconductor component produced in this way comprising one radiation-emitting optical semiconductor chip or a plurality of radiation-emitting optical semiconductor chips on a carrier having flexible conductor tracks, which carrier has been permanently deformed after the process of applying the radiation-emitting optical semiconductor chip or the plurality of radiation-emitting optical semiconductor chips, the radiation-emitting optical semiconductor chip or the plurality of radiation-emitting optical semiconductor chips is/are arranged in an angular fashion with respect to a base side of the semiconductor component. They can be arranged above or below the base side at different distances therefrom. The base side lies in the plane of the originally flat carrier. It can be an underside of the semiconductor component, edge regions of the carrier or regions of the carrier that are provided for making contact with the semiconductor chips extending in said underside.

The flexible conductor tracks allow contact to be made with the semiconductor chips and withstand the deformation of the carrier and their expansion or compression possibly associated therewith, without losing their current conductivity.

The carrier can comprise a thermoplastically deformed material, which offers a high degree of freedom in the deformation of the carrier in order thus to arrange the semiconductor chips in space and thus to influence their emission characteristic. The carrier can be deformed for example in such a way that it has a domed region rising above the base side.

Advantageously, the carrier has a region which rises above the base side or is recessed from the latter and on which the radiation-emitting optical semiconductor chip or at least one portion of the plurality of radiation-emitting optical semiconductor chips is arranged. Said region can have a conical or frustoconical cross section, for example, and is formed by bending or curving by way of a shaping part. If said shaping part remains in the component, the region which rises above the base side or is recessed from the latter is arranged permanently on the shaping part. In such a case, the carrier advantageously has cutouts, such that the surface of the shaping part, through the cutouts, can act on the emission of the chips, for example as a reflector.

The carrier can have a wedge-shaped region having a bend at its tip, said bend rising above the base side. The bend is effected along a folding edge. Such a carrier may have been produced by folding and subsequent casting of the carrier. The plurality of radiation-emitting optical semiconductor chips are arranged on both sides of the folding edge in order thus to direct the emission of the semiconductor chips on the wedge-shaped region into the horizontal plane.

As a result of the deformation of the carrier, the semiconductor chips can be arranged above the base side in a manner vertically offset with respect to one another. A first semiconductor chip from the plurality of radiation-emitting optical semiconductor chips is at a first distance from the base side, which first distance is smaller than a second distance between a second semiconductor chip from the plurality of radiation-emitting optical semiconductor chips and the base side.

In one embodiment, a casting on a carrier top side encloses the radiation-emitting optical semiconductor chip or the plurality of radiation-emitting optical semiconductor chips, in order to protect the semiconductor chips and/or to influence the emission characteristic. This can be effected for example by means of a casting that converts the color of the radiation emitted by the semiconductor chips.

The casting can be layered, the layers having different properties. A first material layer, in which there is an active region of a semiconductor chip from the plurality of radiation-emitting optical semiconductor chips, can be provided below or above a second material layer, in which there is an active region of a further semiconductor chip from the plurality of radiation-emitting optical semiconductor chips.

In one embodiment, one or more heat-dissipating regions can be arranged in the carrier below the radiation-emitting optical semiconductor chip or the plurality of radiation-emitting optical semiconductor chips. The heat dissipation is improved by said region(s), optionally with the support of a heat-dissipating layer at the underside of the carrier or a heat-dissipating wedge.

BRIEF DESCRIPTION OF DRAWINGS

The invention is illustrated below with reference to the drawing in the following figures.

FIG. 19 shows a sectional view of a further exemplary embodiment of a populated, flat, flexible carrier.

FIG. 20 shows a sectional view of the deformed, populated carrier.

FIG. 21 shows a plan view of the deformed region of the carrier.

FIG. 22 shows a sectional view of the deformed, populated carrier with casting.

FIG. 29 illustrates by way of example various elements which can be stacked one above another during deformation.

DETAILED DESCRIPTION

FIGS. 1A to 6B illustrate the production of one exemplary embodiment of a semiconductor component on the basis of the intermediate products thereof in plan view and sectional view.

Figure 1A:
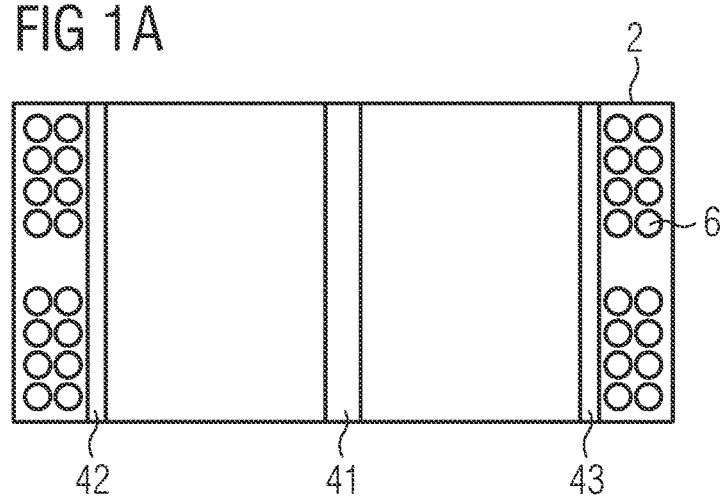
FIGS. 1A and 1B show a plan view and sectional view, respectively, of one exemplary embodiment of a flat, flexible carrier.
Figure 1B:
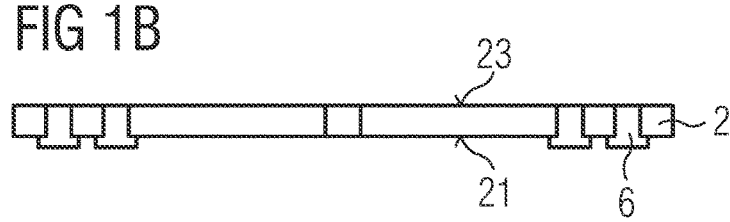

FIGS. 1A and 1B illustrate a preparation step on the basis of a plan view and a sectional view, respectively, of a flat, flexible carrier 2. The carrier 2 is provided for a multiplicity of semiconductor components which can be produced in parallel in an assemblage until the semiconductor components are singulated. FIGS. 1A and 1B show a portion of the carrier for the production of two semiconductor components.

The carrier 2 has an underside 21 and a top side 23 and can be embodied as a flexible film with conductor structures applied thereon. Such a film is also referred to as a "flexible electronics" film. Folding edges 41, 42, 43 are introduced into said film. In this exemplary embodiment, the carrier 2 has parallel folding edges 41, 42, 43, which can be formed by a material weakening or tapering in the carrier material. The later semiconductor component comprises a group of three folding edges 41, 42, 43, of which the two outer folding edges 42, 43 in this exemplary embodiment are spaced apart equidistantly from the central folding edge 41. Contact means 6 are provided outside the two outer folding edges 42, 43. In the later semiconductor component, said contact means allow driving at externally accessible regions of the contact means 6 which are situated at the underside 21 of the carrier. The contact means 6 are embodied as plated-through holes in the carrier 2 in order thus to enable an electrical connection by way of conductor tracks 8 (not illustrated in FIGS. 1A and 1B) on the top side 23 of the carrier.

Figure 2A:
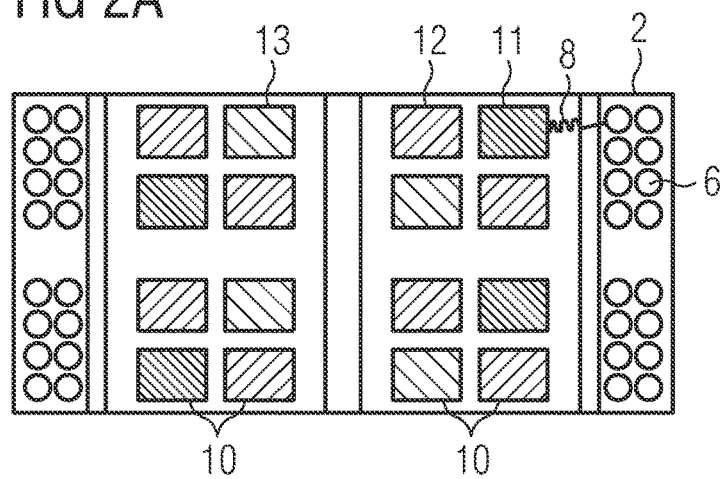
FIGS. 2A and 2B show a plan view and sectional view, respectively, of the carrier after population.
Figure 2B:
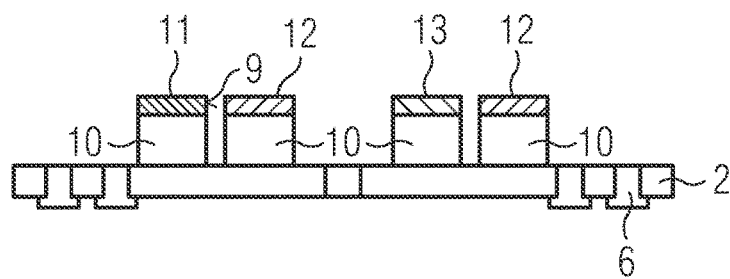

FIGS. 2A and 2B illustrate the population and contacting of the carrier 2 in a subsequent production step. After flexible conductor tracks 8 have been applied on the carrier 2 (for the sake of clarity only one is illustrated by way of example), radiation-emitting semiconductor chips 10 are applied on the carrier 2 and electrically conductively connected to the conductor tracks 8. The flexible conductor tracks 8 do not tear during a deformation of the carrier 2 and their expansion or compression associated therewith. This can be achieved by means of a meandering or zigzag course, for example. The conductor tracks 8 form conductive structures by means of which the semiconductor chips 10 are contacted such that each semiconductor chip 10 is drivable individually via the contact means 6. In the case of the embodiment of the semiconductor component as an optical sensor, besides radiation-emitting semiconductor chips 10, radiation-detecting semiconductor chips are also applied on the carrier 2.

In this exemplary embodiment, the semiconductor chips 10 comprise red-, green- and blue-emitting semiconductor chips 11, 12, 13, with which the carrier 2 has been populated and which are arranged in each case in two rows on both sides of the central folding edge 41. Eight semiconductor chips 10 are provided for each semiconductor component. The semiconductor chips 10 have active regions at their top side, the colored light being emitted by said active regions.

Figure 3A:
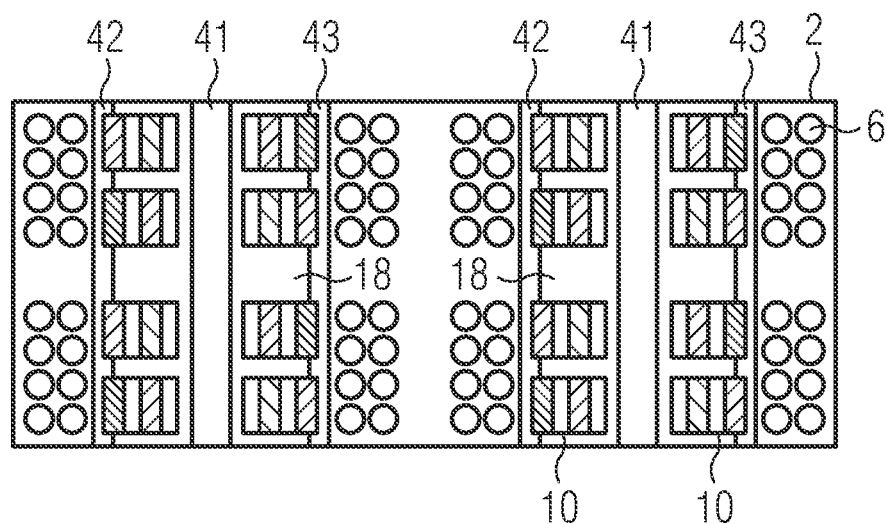
FIGS. 3A and 3B show a plan view and sectional view, respectively, of the bent, populated carrier.
Figure 3B:
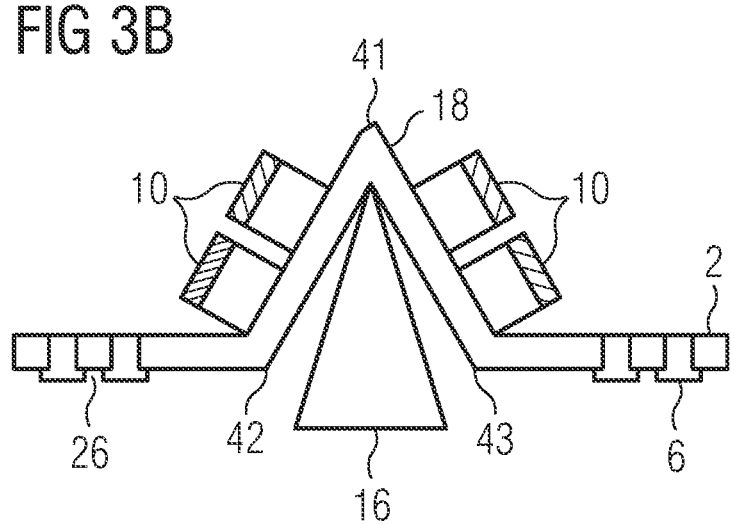

FIGS. 3A and 3B illustrate a folding step in which the carrier 2 is folded by way of a wedge 16, as an exemplary embodiment of a shaping part, along the folding edge 41, 42, 43, thus giving rise to a wedge-shaped carrier region 18, following the shape of the wedge 16. FIG. 3A shows a plan view of the folded carrier 2 for four later semiconductor components. FIG. 3B shows the sectional view for one later semiconductor component.

The semiconductor chips 10 are arranged on the sidewalls of the wedge-shaped region 18. The regions outside the outer folding edges 42, 43 are folded in the opposite direction, such that these regions lie in one plane. The carrier underside of these regions, in which the contact means 6 are also arranged, shapes a base side 26 of the later semiconductor component.

As a result of the folding, the semiconductor chips 10 formerly arranged alongside one another in one plane now lie above the base side 26 in an angular fashion on both sides of the folding edge 41. Their active regions at the chip top sides no longer face upward but rather laterally away from the side surfaces of the wedge-shaped region 18. As a result of the bending, the carrier 2 is shaped such that a considerable proportion of the emission of the semiconductor chips 10 is effected into the horizontal plane. The deformation of the carrier 2 has the effect that the semiconductor chips 10 are arranged in a manner vertically offset with respect to the base side 26.

Figure 4A:
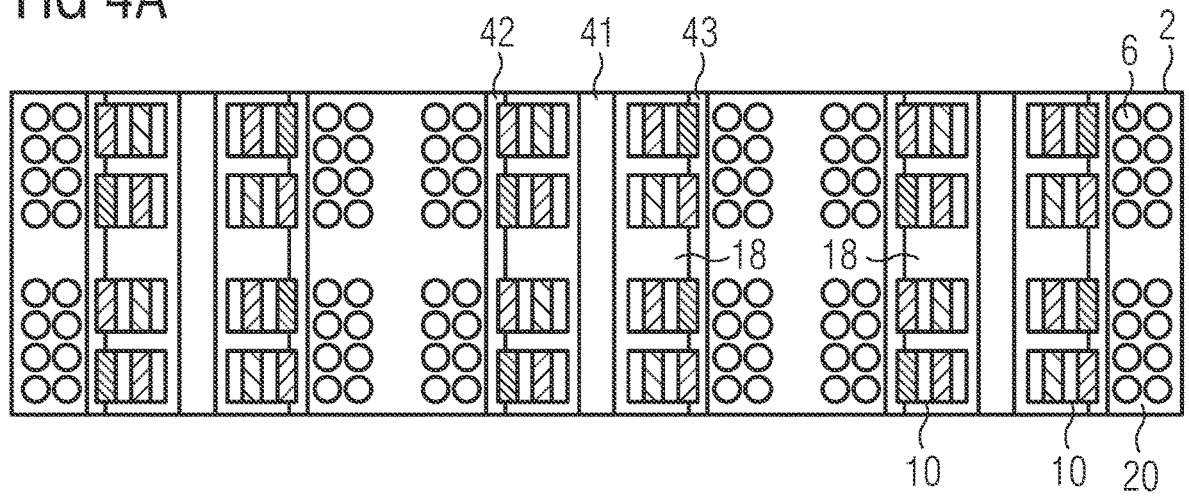
FIGS. 4A and 4B show a plan view and sectional view, respectively, of the bent, populated carrier with casting.
Figure 4B:
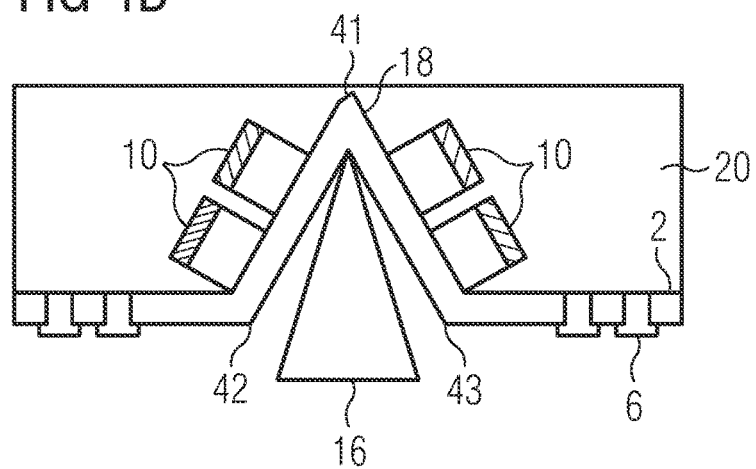

In a subsequent casting step, the folded carrier 2 is fixed in its position by a casting 20. FIG. 4A shows a plan view of the folded carrier 10 for six later semiconductor components. FIG. 4B shows the sectional view for one later semiconductor component.

The casting 20 envelops the semiconductor chips 10 on the top side of the carrier 2, fixes the folded carrier 2 in its position and achieves a mechanical stabilization. The casting material can be silicone.

Alternatively, the shaping part can also be part of the semiconductor component; it is not removed in that case. In such an embodiment, the populated carrier 2 to be deformed with the chips 10 is deformed in a device for deforming, for example by means of pressure and/or temperature, by way of the shaping part; the latter remains in the deformed carrier 2, thus resulting in a hybrid part comprising the metal shape and the insert, for example.

Figure 5:
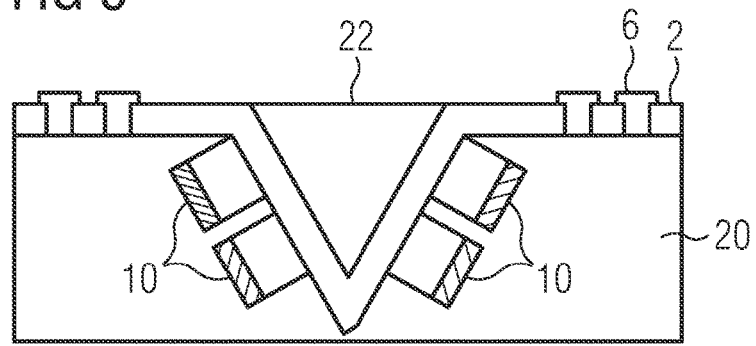
FIG. 5 shows a sectional view of the bent, populated carrier with casting and filled cavity.

In the subsequent step, illustrated in the sectional view in FIG. 5, the carrier 2 with casting 20 is temporarily turned upside down, the wedge 16 is removed and the resultant cavity in the wedge gap is filled with a filler 22 in order to achieve a mechanical stabilization.

Figure 6A:
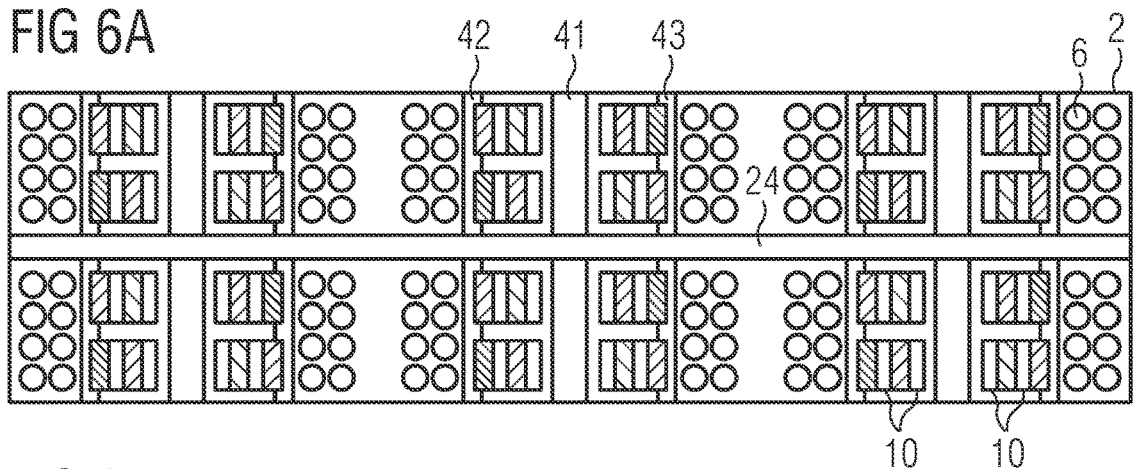
FIGS. 6A and 6B show plan views of the carrier during singulation.
Figure 6B:
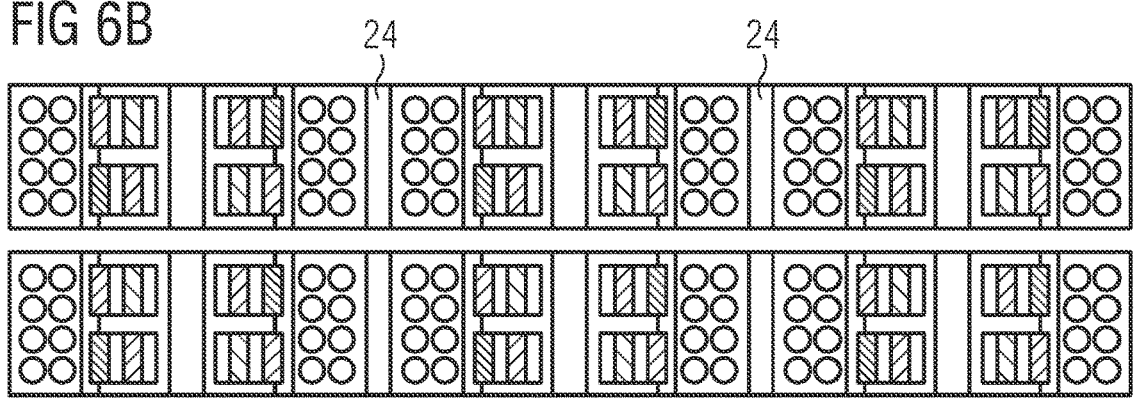

In the singulating step, illustrated in the plan views in FIGS. 6A and 6B, the carrier 2 with casting 20 is singulated to form semiconductor components. This can be done by means of a separating step along a separating line 24 transversely with respect to the folding edges 41, 42, 43, illustrated in FIG. 6A, and a subsequent separating step along a separating line 24 parallel to the folding edges 41, 42, 43, illustrated in FIG. 6B, or vice-versa. Suitable separating methods are sawing or laser cutting, for example.

Figure 7A:
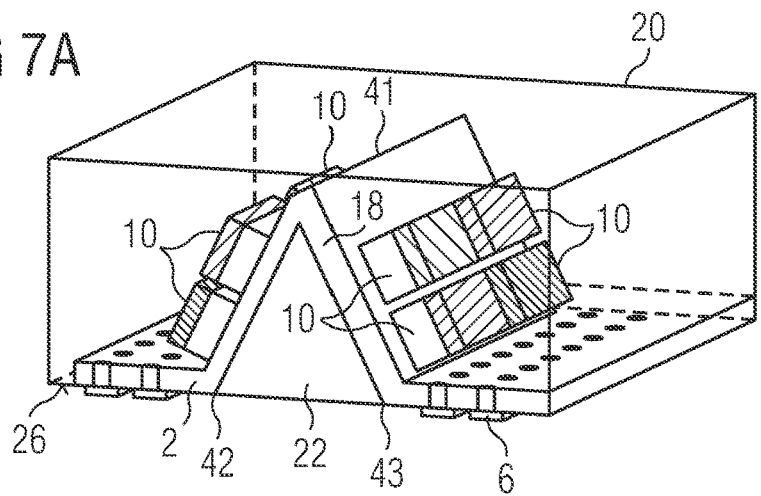
FIGS. 7A and 7B show a three-dimensional view and plan view, respectively, of one exemplary embodiment of a semiconductor component.
Figure 7B:
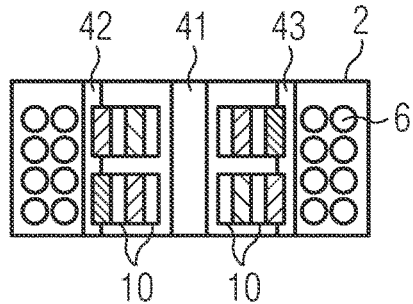

FIGS. 7A and 7B show the semiconductor component thus produced in a three-dimensional illustration and as a plan view, respectively.

The semiconductor component comprises eight radiation-emitting optical semiconductor chips 10 on the flexible carrier 10, which has been deformed such that the semiconductor chips 10 are arranged in an angular fashion with respect to the base side 26 of the semiconductor component. The flexible carrier 2 has a wedge-shaped region 18, the semiconductor chips 10 being arranged at the sidewalls of said wedge-shaped region on both sides of the folding edge 41. The semiconductor chips 10 are vertically offset as a result of the deformation of the carrier 2. The semiconductor component is an SMD component.

The semiconductor component in this exemplary embodiment is a volume emitter that emits on all sides above the base side 26; substantially on both wedge wall sides, however, on account of the positioning of the semiconductor chips. This semiconductor component can be used as an RGB light source since different-colored chips 10 are combined in one volume emitting component. The component is a volume emitting SMD component for use as an RGB package or for incorporation into a package, comparable to a chip.

The semiconductor component has a smaller basic area (also designated by the expression "footprint") than conventional semiconductor components comprising a flat carrier on which a comparable number of semiconductor chips are mounted. The basic area of an exemplary semiconductor component comprising eight semiconductor chips on the folded carrier can be 1.5 mm×1.5 mm.

Furthermore, the production method described above makes it possible to set the emission behavior in a flexible manner, for example by way of the choice of the angle of the wedge surfaces with respect to one another. The color of the light emitted by the semiconductor component can be influenced by way of the angle and also the setting of the color locus. Furthermore, the semiconductor component makes it possible to avoid surfaces with light absorbance.

Figure 8:
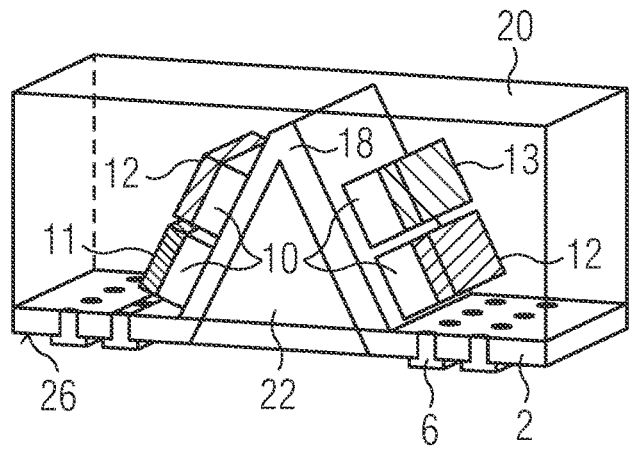
FIG. 8 shows a three-dimensional view of a further exemplary embodiment of a semiconductor component.

FIG. 8 shows a further exemplary embodiment of a semiconductor component. In order to avoid repetition, only the differences with respect to the exemplary embodiment shown in FIGS. 7A and 7B will be described. The semiconductor component is likewise a volume emitter, but comprises only four semiconductor chips 10. One red and one green semiconductor chip are arranged on one side of the folding edge 41 in a manner vertically offset with respect to the base side 26; one blue and one green semiconductor chip are arranged on the other side of the folding edge 41 in a manner vertically offset with respect to the base side 26.

Figure 9:
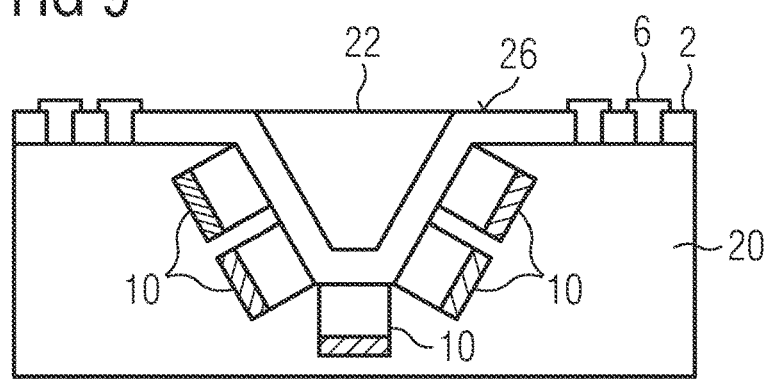
FIG. 9 shows a cross section of a further exemplary embodiment of a semiconductor component.

FIG. 9 shows a further exemplary embodiment of a semiconductor component in cross section. In order to avoid repetition, only the differences with respect to the exemplary embodiment shown in FIGS. 7A and 7B will be described. The semiconductor component is likewise a volume emitter, but comprises a frustoconical region rising above the base side 26. The frustoconical region has not only oblique sides but also a plateau-shaped region parallel to the base side. A chip 10 arranged on the plateau-shaped region emits upward, with the result that the emission characteristic in this exemplary embodiment is directed laterally and upward.

Figure 10:
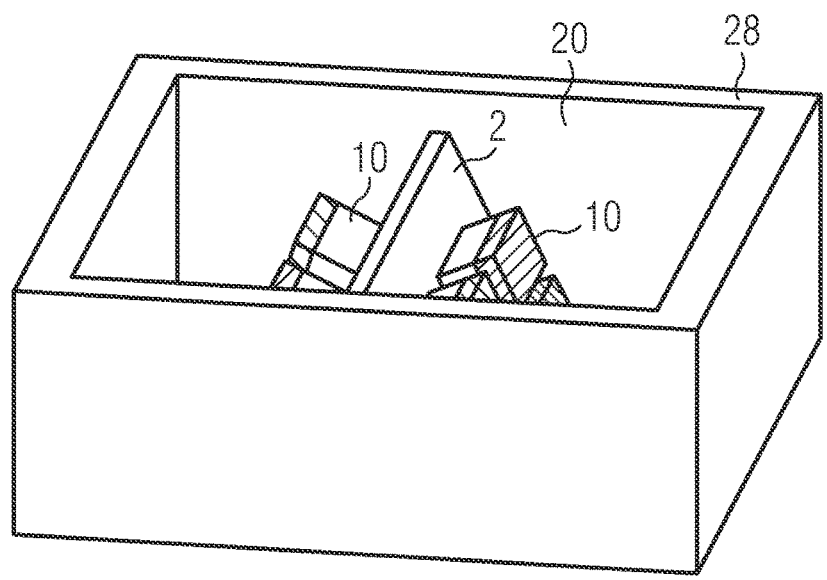
FIG. 10 shows a three-dimensional view of a further exemplary embodiment of a semiconductor component.

FIG. 10 shows a further exemplary embodiment of a semiconductor component, which differs from that illustrated in FIGS. 7A and 7B by virtue of a lateral frame 28 around the casting 20. Such a frame 28 can be produced before the singulating step by separating trenches that do not extend as far as the underside of the carrier 2 being filled, for example with titanium dioxide $TiO_2$ (the separating trenches run along the separating lines 24 shown in FIGS. 6A and 6B). The separating trenches can be sawing trenches. This exemplary embodiment thus yields a complete RGB package. Alternatively or additionally, it is conceivable to apply a reflective layer or a light-nontransmissive layer to the sidewalls of the casting 20 after the singulating step.

By using different colored semiconductor chips 10 in a semiconductor component with the frame 28, shaped for example by $TiO_2$ casting, an RGB light source is formed. The frame 28 has a directional effect on the emission characteristic by virtue of the emitted light being directed upward.

Figure 11:
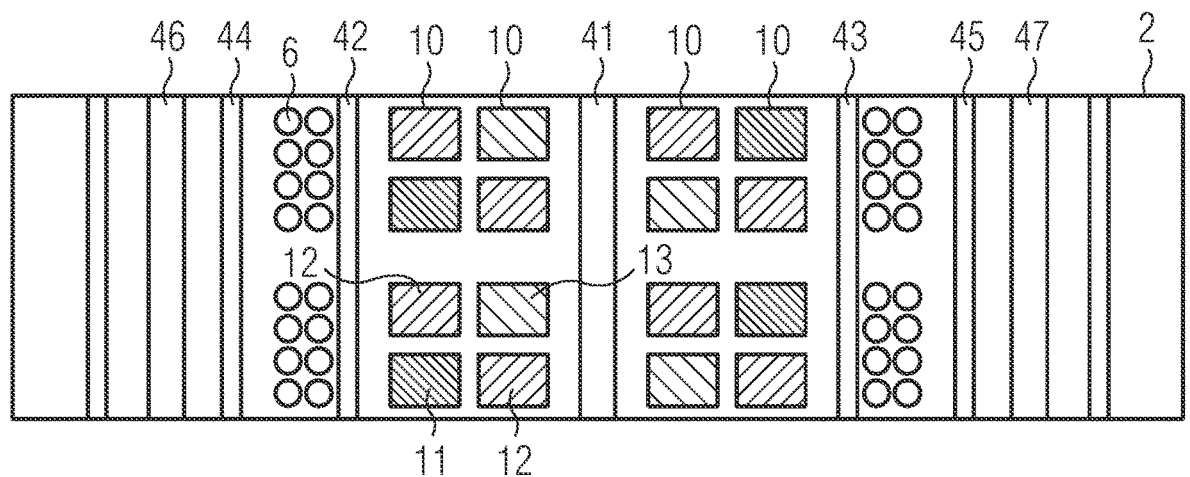
FIG. 11 shows a plan view of a further exemplary embodiment of a populated, flat, flexible carrier.
Figure 12:
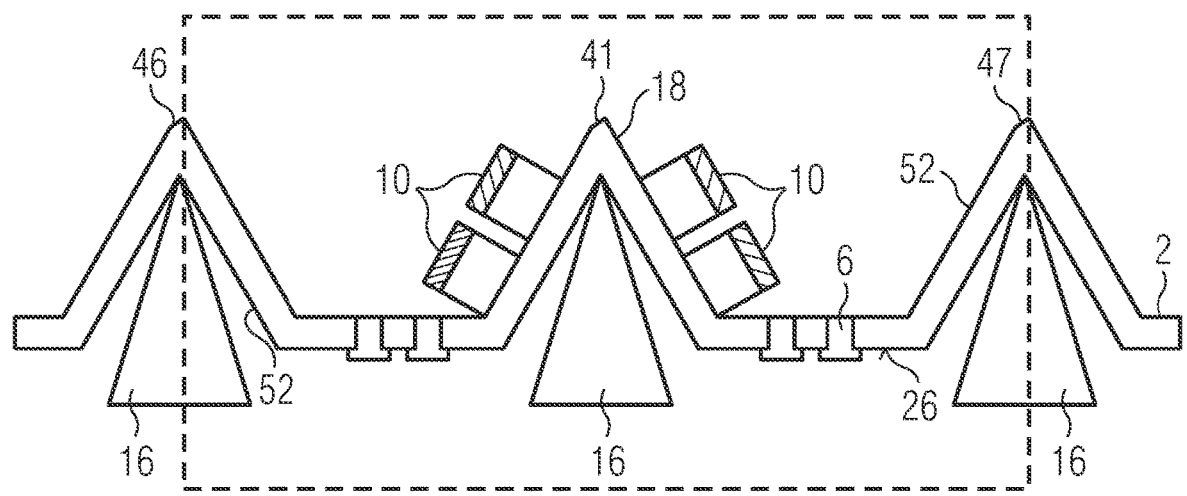
FIG. 12 shows a sectional view of the bent, populated carrier.

FIGS. 11 and 12 illustrate steps for the production of a further exemplary embodiment of a semiconductor component on the basis of the intermediate products. In order to avoid repetition, only the differences with respect to the production method described in FIGS. 1A to 6B will be described and the resultant differences between the semiconductor component thus produced and the semiconductor component illustrated in FIGS. 7A and 7B will be described.

FIG. 11 shows the plan view of one exemplary embodiment of a carrier 2 that has already been populated. Besides the central folding edge 41, it has two further parallel folding edges 42, 43, 44, 45 on both sides and also outer folding edges 46, 47, along which the boundary of the later semiconductor component runs. In comparison with the carrier 1 shown in FIGS. 1A and 1B, this exemplary embodiment is provided with further folding edges 44, 45, 46, 47 in order to produce oblique package walls 52 of the later semiconductor component.

Along the central and outer folding edges 41, 54, 47, the carrier is bent in each case by way of a wedge 16, as illustrated in FIG. 12. Along the folding edges 42, 43, 44, 45 extending therebetween, bending is effected in the opposite direction, with the result that the carrier region extends therebetween along the base side 26 of the later semiconductor component. The semiconductor chips 10 are raised up by the wedge-shaped carrier region 18 rising above the base side 26. The carrier regions facing the wedge-shaped region 18 with the semiconductor chips 10 on both sides of the wedge-shaped region form oblique sidewalls 52 of the later semiconductor component once singulation has been effected along the outer folding edges 46, 47. This basic cell of the later package is illustrated on the basis of a frame 50. After the folding described above, a casting 20 is applied and the further steps described in association with FIGS. 1A to 6B are carried out. The cavity produced by the removal of the wedge 16 below the outer folding edges 46, 47 does not have to be filled.

By using different colored semiconductor chips 10 in a semiconductor component with straight or, as described above, oblique walls 52, shaped by TiO₂ casting, for example, an RGB light source is formed. Such a package emits substantially upward, which is also referred to as top emitting. It can be an SMD package.

Figure 13:
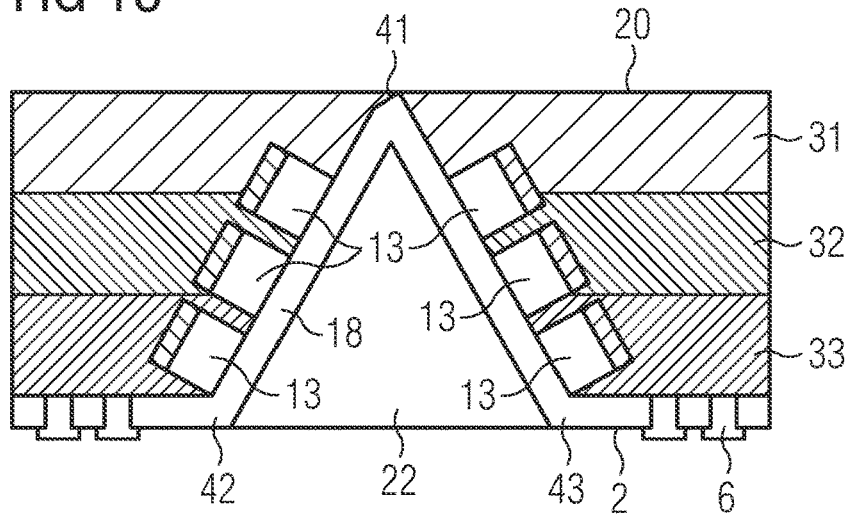
FIG. 13 shows a sectional view of a further exemplary embodiment of a semiconductor component.

FIG. 13 shows a further exemplary embodiment of a semiconductor component in sectional view. In order to avoid repetition, only differences with respect to the exemplary embodiment shown in FIGS. 7A and 7B will be described.

This exemplary embodiment comprises three blue-emitting semiconductor chips 12 arranged one above another on both sides of the folding edge 41. The casting 20 comprises a plurality of layers 31, 32, 33, which influence the emission of the semiconductor chips 12 arranged therein in different ways. The layers 31, 32, 33 are arranged such that the active regions of the semiconductor chips 12 are positioned in different layers 31, 32, 33. The active regions of the upper semiconductor chips are arranged in the upper casting layer 31. The active regions of the central semiconductor chips 12 are arranged in the central casting layer 32. The active regions of the lower semiconductor chips 12 are arranged in the lower casting layer 33.

The choice of the materials for the casting layers 31, 32, 32 can influence the emission characteristic of the active regions arranged therein in a targeted manner. In this exemplary embodiment, all the semiconductor chips 12 emit blue. The upper layer 31 is a clear casting. The central layer 32 is a casting having green quantum dots, which are excited by the light emitted by the semiconductor chips 12 to emit green light. The lower layer 33 is a casting having red quantum dots, which are excited by the light emitted by the semiconductor chips 12 to emit red light. An emission in red, green, blue is effected as a result of the conversion in this arrangement. A converting RGB component thus results.

By using identically colored semiconductor chips 12, arranged at different levels and in a layered casting 20 having different colored phosphors, an RGB light source is formed.

Figure 14:
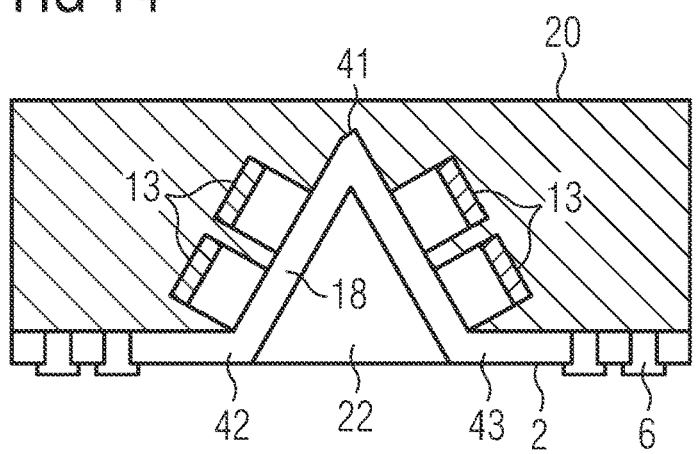
FIG. 14 shows a sectional view of a further exemplary embodiment of a semiconductor component.

FIG. 14 shows a further exemplary embodiment of a semiconductor component in a sectional view. In order to avoid repetition, only differences with respect to the exemplary embodiment shown in FIGS. 7A and 7B will be described.

In this exemplary embodiment, the semiconductor chips 12 on both sides of the wedge-shaped region 18 likewise emit blue. The casting 20 has a phosphor, with the result that the semiconductor component emits converted white light and has the function of a white LED. A converting white light component results. A white light source can thus be produced.

Figure 15:
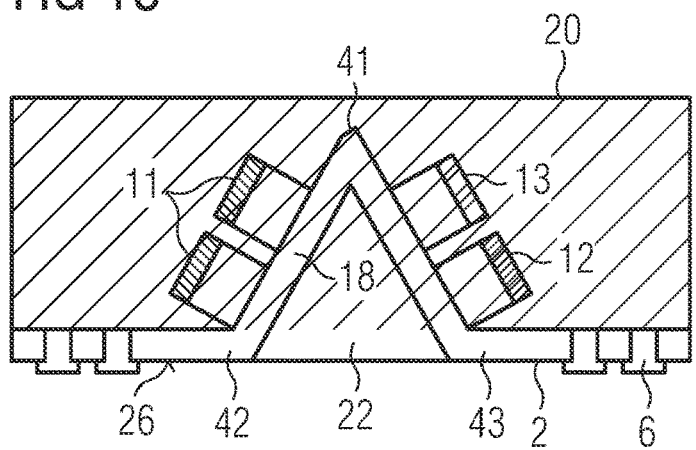
FIG. 15 shows a sectional view of a further exemplary embodiment of a semiconductor component.

FIG. 15 shows a further exemplary embodiment of a semiconductor component in sectional view. In order to avoid repetition, only differences with respect to the exemplary embodiment shown in FIGS. 7A and 7B will be described.

In this exemplary embodiment, the red semiconductor chips 11 are arranged on one side of the wedge-shaped region 18 and the blue and green semiconductor chips 12, 13 are arranged on the other side. Red semiconductor chips 11 have a poor reflectivity in the blue spectral range. It is therefore advantageous to arrange the red semiconductor chips 11 on one side of the wedge-shaped region 18 and the blue and green semiconductor chips on the other side. However, this adversely affects the color depending on the angle above the base side 26.

In an alternative configuration (not illustrated), instead of the two semiconductor chips 10 on both sides of the folding edge 41, three semiconductor chips can be provided on each side. In the exemplary embodiment, there are then three red semiconductor chips 11 on one side and one red, one green and one blue semiconductor chip on the other side.

It is also conceivable to provide a diffuser for light mixing directly in the casting.

FIGS. 16A, 16B, 17A and 17B illustrate steps for the production of a further exemplary embodiment of a semiconductor component. In order to avoid repetition, only the differences with respect to the production method illustrated in FIGS. 1A to 6B and the semiconductor component thus produced will be described.

Figure 16A:
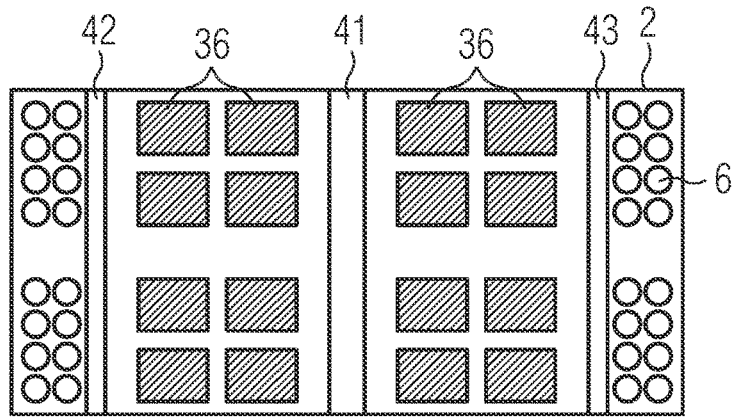
FIGS. 16A and 16B show a plan view and sectional view of a further exemplary embodiment of a flat, flexible carrier.
Figure 16B:
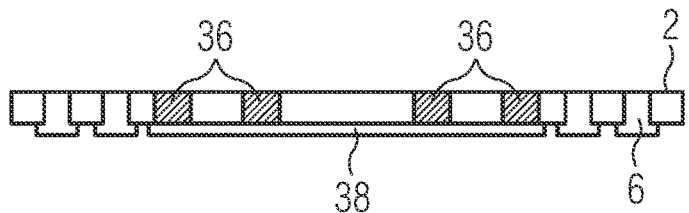
Figure 17A:
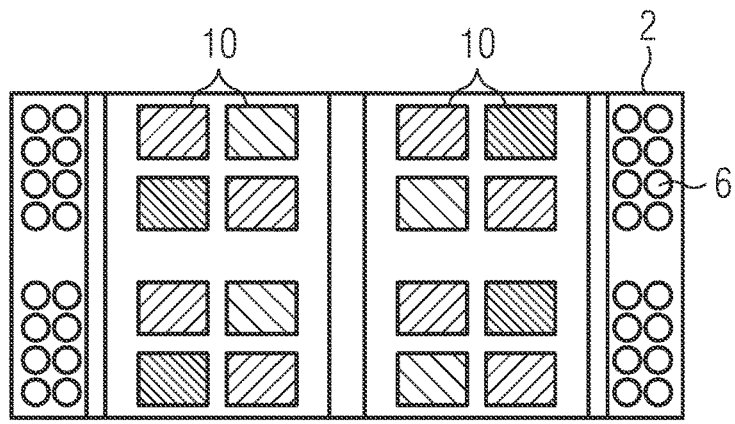
FIGS. 17A and 17B show a plan view and sectional view of the populated, flat, flexible carrier.
Figure 17B:
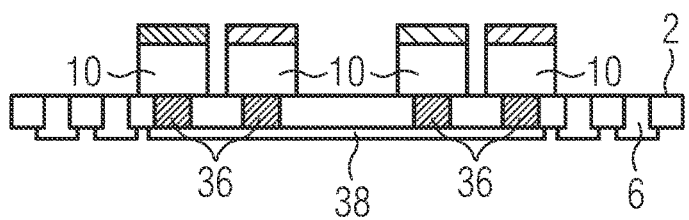

FIGS. 16A and 16B show in plan view and sectional view, respectively, a provided carrier 2 having an improved thermal conductivity in order to enable an improved dissipation of heat from the semiconductor chips 10. For this purpose, at the locations on which the semiconductor chips 10 are positioned later, heat-conducting plinths 36 are embossed into the carrier film and a metal film or coating 38 is applied on the rear side 21 of the carrier, which emits the heat dissipated by the heat-conducting plinths 36. FIGS. 17A and 17B show in plan view and sectional view, respectively, the semiconductor chips 10 placed on the carrier 2 after population.

For heat dissipation purposes, additionally or alternatively, it is also possible to provide a galvanic filling in the wedge-shaped cavity of the carrier 5, as is illustrated in FIG. 5. This filling improves the thermal conductivity once again.

The semiconductor components are, of course, not restricted to the number—illustrated by way of example—of semiconductor chips 10 in a semiconductor component. A plurality of rows of chips and columns of chips can be provided.

Figure 18A:
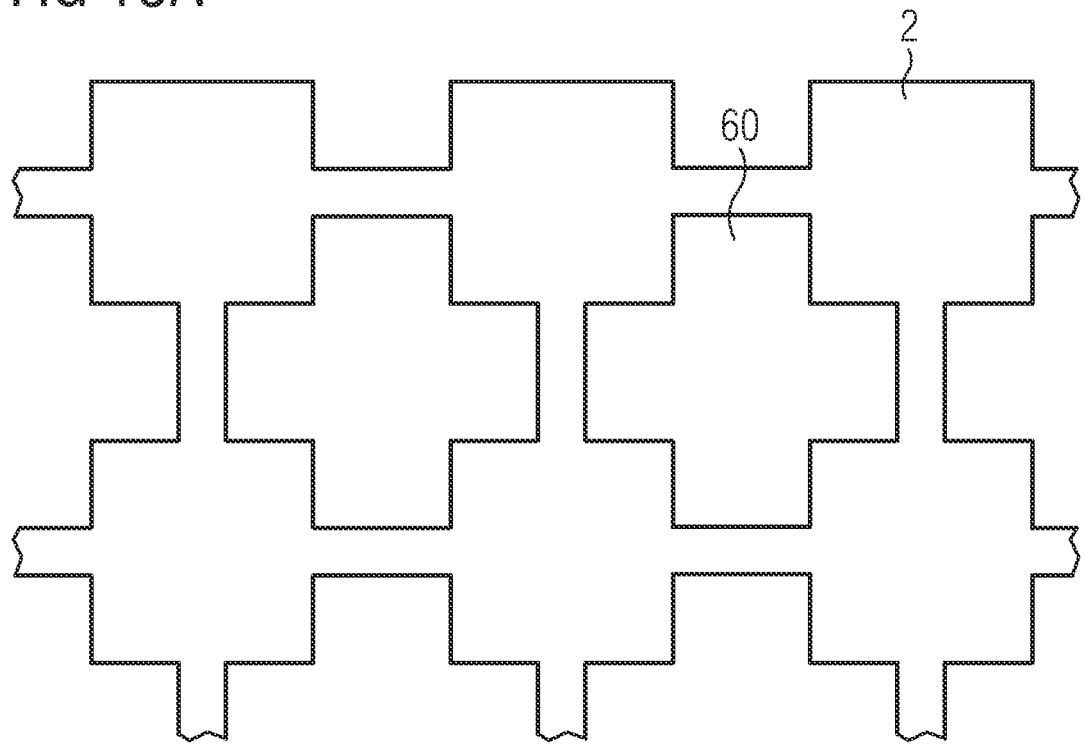
FIGS. 18A and 18B illustrate the production of a further exemplary embodiment of a semiconductor component.
Figure 18B:
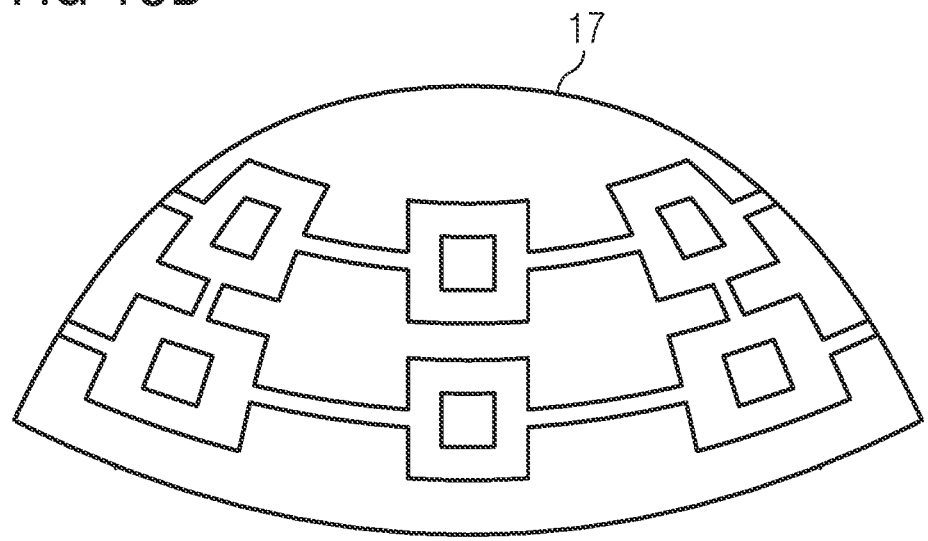

FIGS. 18A and 18B illustrate the production of a semiconductor component comprising a carrier 2 having stamped-out cutouts 60, which enables a partial structuring. FIG. 18A shows the flat carrier 2 having cutouts 60. In this case, the carrier 2 has a plurality of island-type square regions connected to one another via webs. The possible shape of the cutouts 60 is diverse and can be adapted to the desired use and the later deformation of the carrier 2. The chips 10 can be placed on the island-type square regions.

FIG. 18B shows the carrier 2 with the placed chips 10, said carrier being deformed by the shaping part 17. After deformation, the carrier 2 remains on the shaping part 17, which can have an optical function, for example as a reflector, in order thus to influence the emission characteristic of the semiconductor chips 10. In this exemplary embodiment, the shaping part 17 is domed. The deformation can be fixed by casting or, in the case of a thermoplastic carrier material, simply by cooling. The further production steps are carried out as described in the previous exemplary embodiments.

FIGS. 19 to 22 illustrate the production of a further exemplary embodiment of a semiconductor component on the basis of its intermediate products.

Firstly, semiconductor chips 13 are placed onto a planar thermoplastic carrier 2 having flexible conductor tracks 8, which carrier is deformable under the influence of heat, and are connected to the flexible conductor tracks 8. The semiconductor chips 13 emit blue in this exemplary embodiment. FIG. 19 shows the planar carrier 2 with the placed semiconductor chips 13. Carrier material can be a polymer.

Furthermore, the carrier 2 has contact means 6 and conductor tracks 8; the latter are not illustrated in FIG. 19 for the sake of clarity.

The carrier 2 is heated and deformed. The deformation can be effected by reduced pressure and/or by excess pressure into the desired shape for example by means of thermoforming of the heated polymer. A similar method is employed in the case of PET bottles. FIG. 20 shows an exemplary domed deformation 19 of the carrier 2, such that there rises above a base side 26 of the later semiconductor component not only the domed region 19 but also the semiconductor chips 13 which are arranged on the domed region 19 and are now arranged both vertically offset with respect to one another and in part in an angular fashion with respect to the base surface 26. The cavity that arises as a result of the deformation influences the emission characteristic of the semiconductor chips 13, with the result that a good intermixing of the light emitted by the different semiconductor chips is effected. This is advantageous particularly in the case of light of different colors.

FIG. 21 shows the domed region 19 of the deformed carrier 2 in plan view. The flexible conductor tracks 8 are embodied in a meandering fashion, such that they do not tear even in the event of an expansion or compression of the carrier surface on which they are applied. This can also be achieved by means of some other non-rectilinear course, for example a zigzag course.

With the use of a thermoplastic carrier 2 in combination with flexible conductor tracks 8, it is possible to produce freeform shapes without folding. The deformation is maintained after cooling. The surfaces can be configured such that they are radiation-stable by means of coating in a further step.

FIG. 22 illustrates the step in which the semiconductor chips 13 are casted after the deformation of the carrier 1 by a layered casting 20 being introduced into the domed region 19 shaping a cavity. The layers 31, 32, 33 are composed of different casting material in order to influence the emission characteristic of the active regions of the semiconductor chips 13 that emit therein. In this regard, the emission characteristic of the blue semiconductor chips 13 is influenced in various ways. In this exemplary embodiment, the casting 20 serves substantially as a converter and not necessarily for stabilizing the deformation. The lower semiconductor chip 13 is casted with a first material, such that the emitted light is converted to red in the lower layer 33. The central semiconductor chip 13 is casted with a second material, such that the emitted light is converted to green in the central layer 32. The upper semiconductor chip 13 is casted with a clear casting. Consequently, the upper layer 31 does not influence the emitted color or influences it only insignificantly. An emission in red, green, blue thus results. Alternatively, it is conceivable for the converter to be applied before the deformation, such that the state described results after the deformation. Nevertheless, the deformation is irreversible.

In the case of the thermoplastically deformed carrier 2, too, other combinations of casting 20 and semiconductor chips 10 are conceivable, as have been described in association with FIGS. 7A, 7B, 12, 13 and 14. Red, green and blue semiconductor chips 11, 12, 13 can be provided with a clear casting 20. Semiconductor chips of the same color can be provided with a converter casting, for example in order to form a white light source.

The semiconductor components comprising a thermoplastically deformed carrier 2 can also be produced in parallel in an assemblage, wherein the carrier regions for the later semiconductor components in parallel are populated, then deformed, possibly casted and finally singulated.

Figure 23:
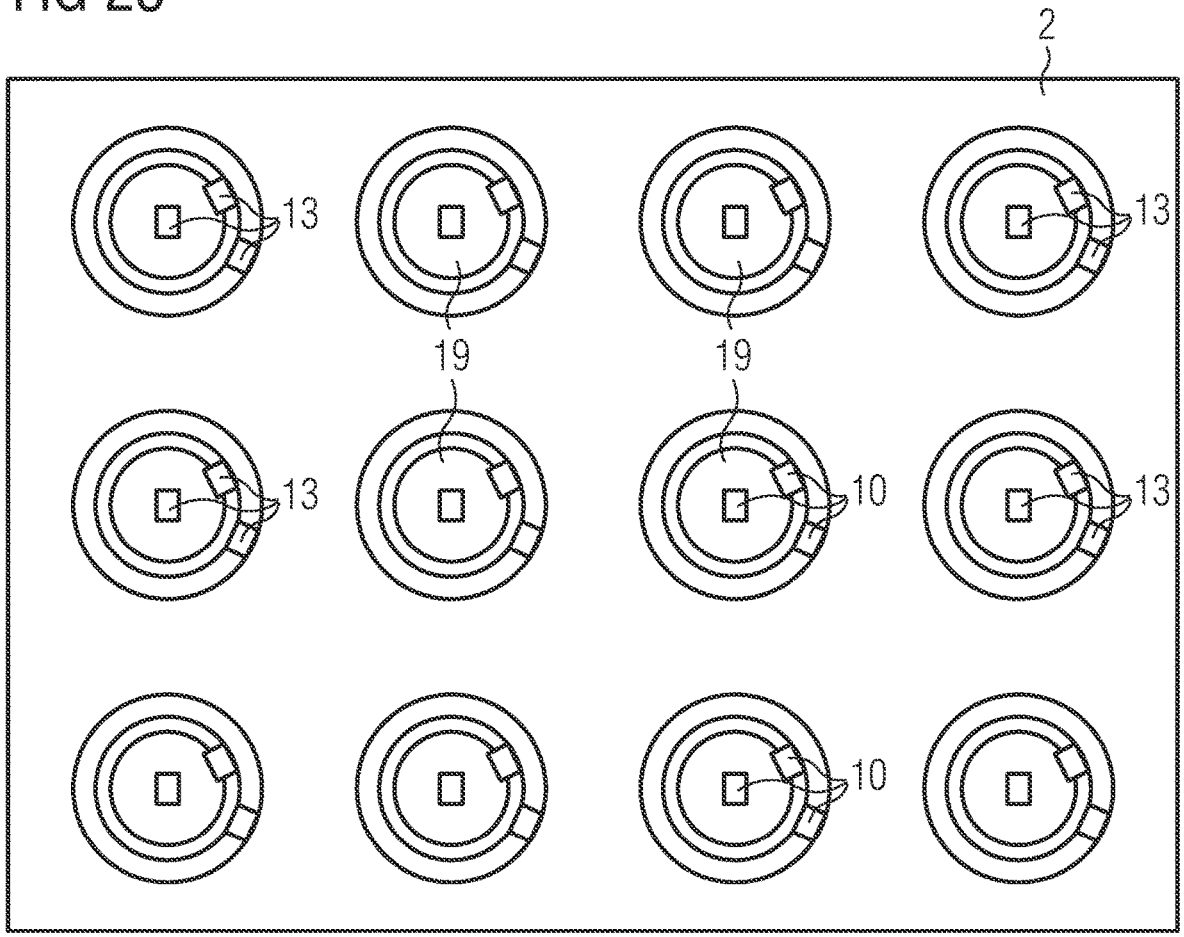
FIG. 23 shows a plan view of a further exemplary embodiment of a semiconductor component.

FIG. 23 shows a further exemplary embodiment of a semiconductor component in plan view. In this exemplary embodiment, a plurality of domed cavities 19, the shape of which may be similar to that of a yogurt container, are provided in the same semiconductor component. Three blue semiconductor chips 13 are arranged in each cavity, the emission of said semiconductor chips being influenced by the layered converter described above such that red, green, blue is emitted.

This semiconductor component is produced by a process in which, after the semiconductor chips 10 have been mounted on the planar carrier 2, the latter is deformed so as to give rise to a multiplicity of cavities, into which the casting 20 is introduced. Such a semiconductor component can have a display function.

Figure 24:
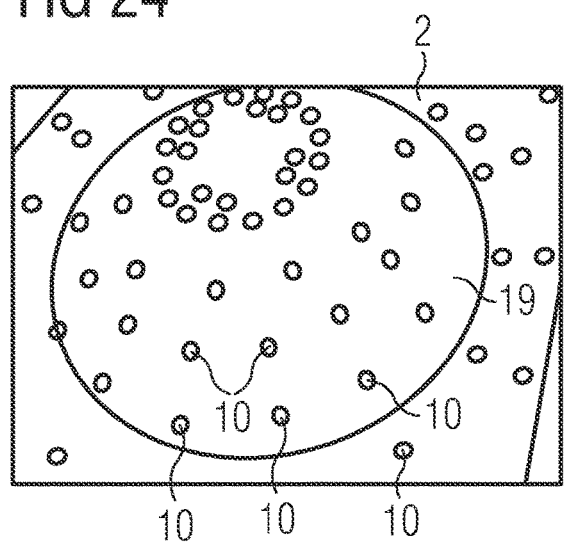
FIG. 24 shows a three-dimensional view of a further exemplary embodiment of a semiconductor component.

FIG. 24 shows a further exemplary embodiment of a deformed carrier in a three-dimensional view, wherein the thermoplastic carrier 2 is deformed such that it has a domed region 19. In this freeform arrangement, the carrier 2 has a multiplicity of semiconductor chips of different colors, which are arranged both within and outside the domed region.

The production methods outlined above allow the shape of the semiconductor component to be adapted for a wide variety of applications and to be combined with electronics. Production is cost-effective, moreover, since standard mounting processes can be used during population. It is only afterward that the carrier is deformed.

In this way, it is possible to produce semiconductor components which serve as a light source, allow a flexible geometric arrangement of the semiconductor chips 10, have a reduced basic area in comparison with conventional semiconductor components and are able to be employed directly as CSP or as light source in a package.

In embodiments in which the semiconductor component is an RGB component, additional advantages afforded are that a homogenous color emission independently of the angle is possible or the absorption of the red chips can be reduced. A homogeneous color impression in the near field results. Individual chips are discernible to a lesser extent than in the case of conventional semiconductor components.

Semiconductor components of this type can be used in medical technology, for example as an electronic plaster with integrated sensor system or irradiation. Further possible fields of use are prosthetic implants, in the documentation of the healing process or development steps. Fields of application arise in the area of consumer electronics, too, for example in domestic appliances or in freeform surfaces combined with electronics. In industrial technology, possible fields of application would be robotics, human-machine interfaces, gripper simulation and gripper control. A further field of application is textile materials having additional functions, so-called "smart textiles". They can warn against diseases, transmit data and store energy, for example. Applications are, for example, encapsulations against environmental influences, in design and in wristbands not just for watches.

Figure 25A:
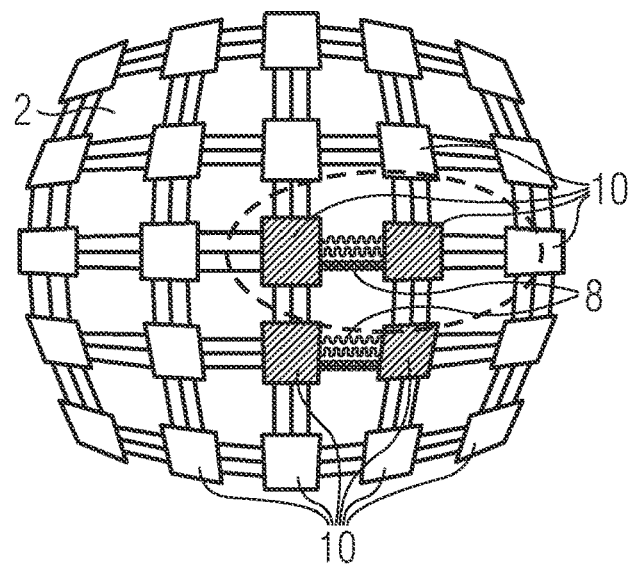
FIG. 25A shows a further exemplary embodiment of a semiconductor component.

FIG. 25A shows a further exemplary embodiment of a semiconductor component comprising a multiplicity of micro-LEDs as exemplary embodiments of semiconductor chips 10, which are arranged in the form of a matrix. The micro-LEDs are connected to the adjacent micro-LEDs via flexible conductor tracks 8. The semiconductor chips 10 applied on a carrier 2 are embodied as micro-LEDs embedded in deformable plastics films. The films are deformed as a sandwich to form the semiconductor component, which can also be regarded as a multifunctional light element, as is indicated by the rounded shape after deformation in FIG. 25A.

Figure 25B:
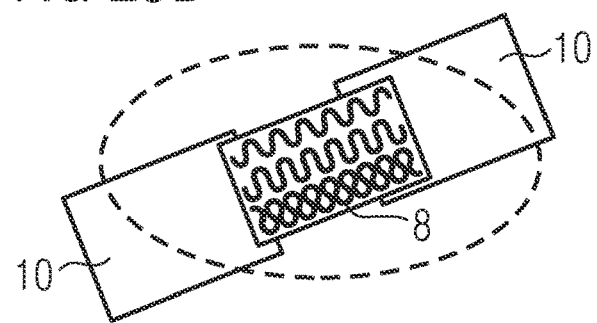
FIGS. 25B and 25C show excerpts from the exemplary embodiment from FIG. 25A.
Figure 25C:
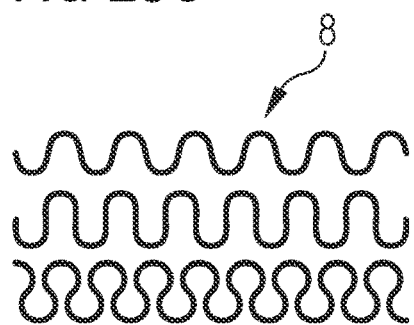

FIG. 25B shows an excerpt from the semiconductor component in FIG. 25A, said excerpt being marked by the dashed line. The excerpt illustrates the connection of two micro-LEDs by flexible conductor tracks 8 embodied in a meandering fashion, so that they do not tear even upon deformation. The micro-LEDs can have for example a basic area of approximately 10 µm×10 µm and approximately 5 µm flexible thin-film LED layers. FIG. 25C shows examples of flexible conductor tracks 8 in an enlarged view. The deformation results in the meander loops being drawn apart.

Figure 26:
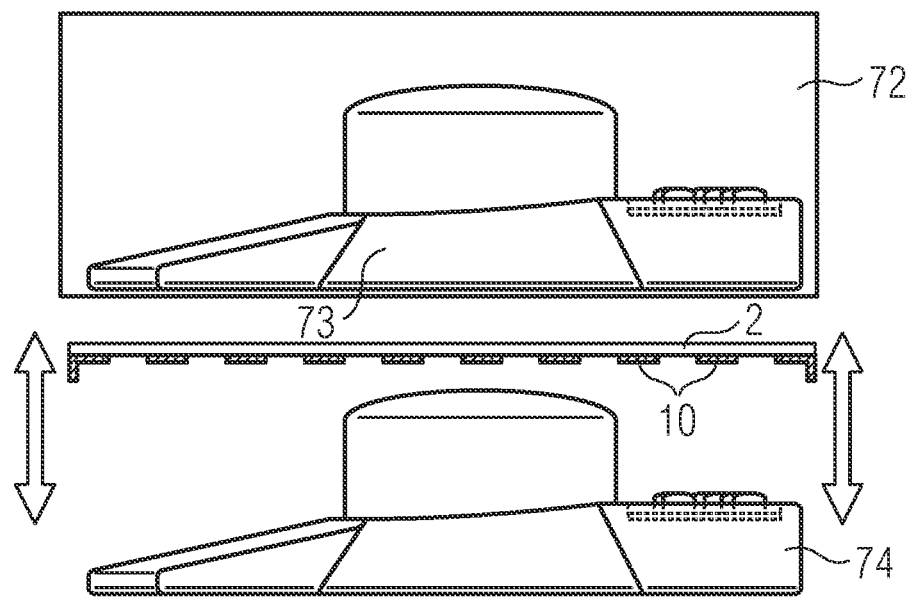
FIG. 26 illustrates the production of a semiconductor component.

FIG. 26 illustrates the production of the semiconductor component in which, as an exemplary embodiment of the semiconductor chips 10 applied on the carrier 2, a film having LED semiconductor chips is inserted into a three-dimensional pressing mold, for example a metal mold, is deformed and is encapsulated with a rigid material in a dimensionally stable manner. The pressing mold comprises a lower and an upper mold part 72, 74. The lower mold part 74 is a thermoforming mold, onto which the carrier 2 having the semiconductor chips 10 is pressed by means of the upper hollow mold part 72 and is deformed in this way. The upper mold part 72 has a recess 73 corresponding to the shape of the later semiconductor component. The lower mold part 74 has a shape corresponding to the later semiconductor component. During deformation, the upper mold part 72 moves over the lower mold part 74, with the result that the carrier 2 is pressed into the predefined shape. This type of deformation is also referred to as thermoforming (by means of a press).

Figure 27A:
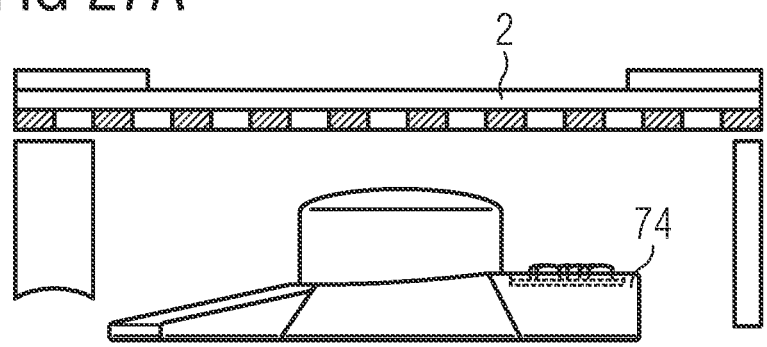
FIGS. 27A to 27E illustrate the steps of the production method.
Figure 27B:
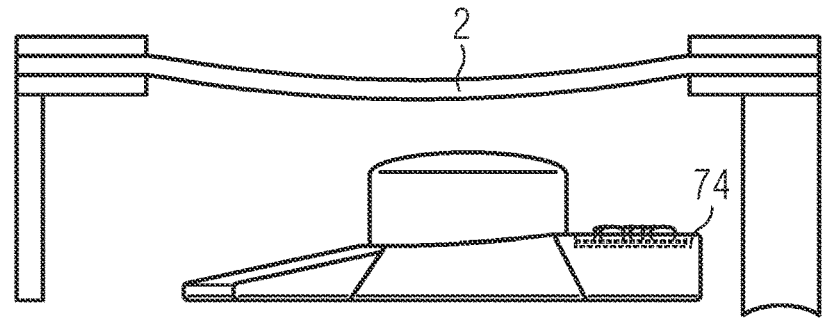

FIGS. 27A to 27E illustrate the steps of the production method on the basis of intermediate products. FIG. 27A shows the deformable carrier 2 having the LEDs in the thermoforming mold 74. FIG. 27B shows the heating of the carrier 2 having the LEDs in order to deform it. The deformation is carried out next, wherein the carrier is placed against the mold parts and thereby deformed. This can be effected by the upper mold part 72 being pressed together with the thermoforming mold 74, as has already been illustrated in FIG. 26.

Figure 27C:
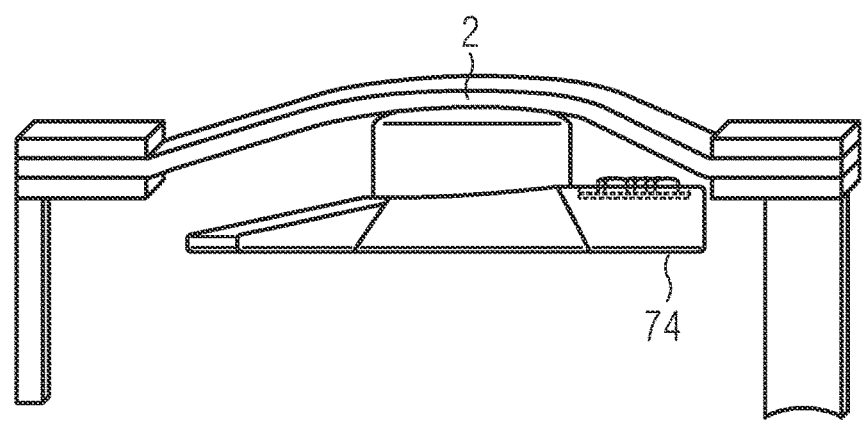
Figure 27D:
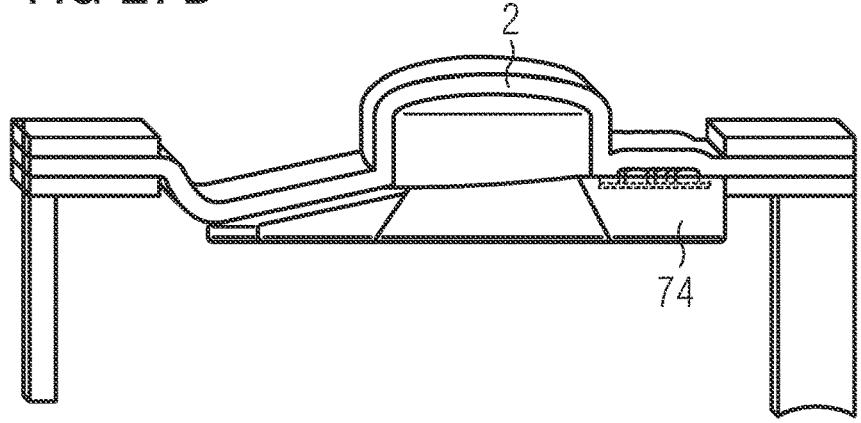

Alternatively, the deformation of the heated carrier 2 can also be effected by applying to the carrier 2 pressure from above, i.e. on the side facing away from the thermoforming mold 74, and a vacuum from below, i.e. on the side facing the thermoforming mold 74, with the result that the carrier 2 deforms, as illustrated in FIG. 27C, and nestles against the mold and solidifies there, as illustrated in FIG. 27D. This can be done by cooling. A membrane 77 is usually applied on that side of the carrier 2 which faces away from the thermoforming mold 74, said membrane likewise being deformed by pressure and vacuum. The method described is also referred to as thermoforming by means of vacuum or vacuum thermoforming.

Figure 27E:
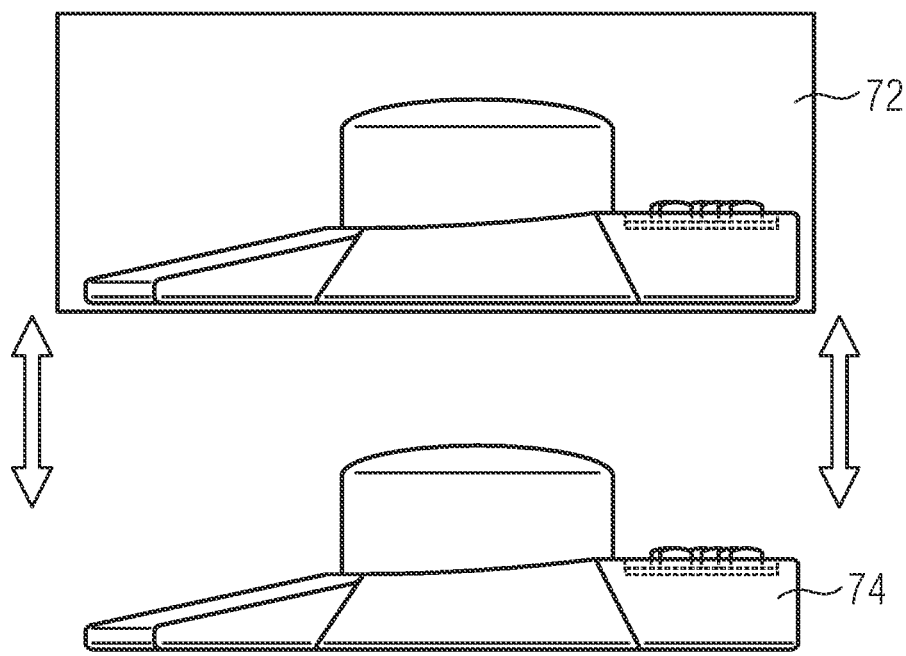

The fixing of the deformation can alternatively or additionally be achieved by means of an encapsulation of the deformed carrier with a thin plastics layer. This is illustrated in FIG. 27E for thermoforming by means of a press, as already described in association with FIG. 26. The encapsulation can be effected by the encapsulating plastic being introduced into the pressing mold after deformation, i.e. after the mold parts 72, 74 have been pressed onto one another.

Figure 28:
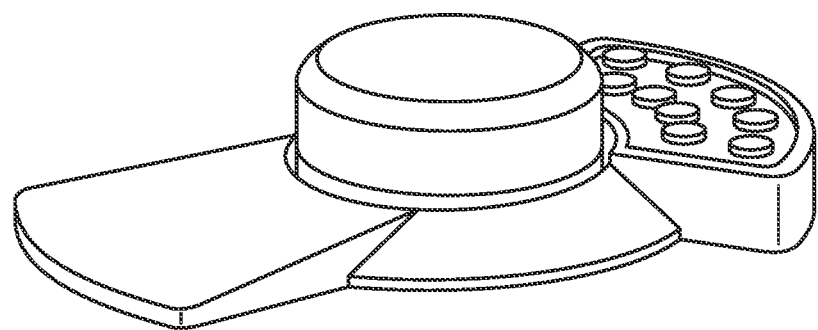
FIG. 28 shows one exemplary embodiment of the finished semiconductor component.

FIG. 28 shows one exemplary embodiment of the finished semiconductor component. The method described above makes it possible to produce not only small semiconductor components but also parts that can have a module size and function, for example display, control and operating elements.

FIG. 29 illustrates by way of example various elements which can be stacked one above another during deformation. Various elements are stacked between the upper mold part 72 of the pressing mold or the membrane 77 and the thermoforming mold 74. A buffer layer 82, for example a silicone buffer, is provided on the upper mold part 72 or the membrane 77. A buffer insert 88 is applied on the thermoforming mold 74. Between these buffer layers 82, 88, a molding foam, which can optionally have electronic components, and the flexible carrier 2 having the LED semiconductor chips 10 and scratch-resistant and radiation-stable covering layers 84 are provided, which are deformed and connected to one another in order to shape the semiconductor component.

Figure 30A:
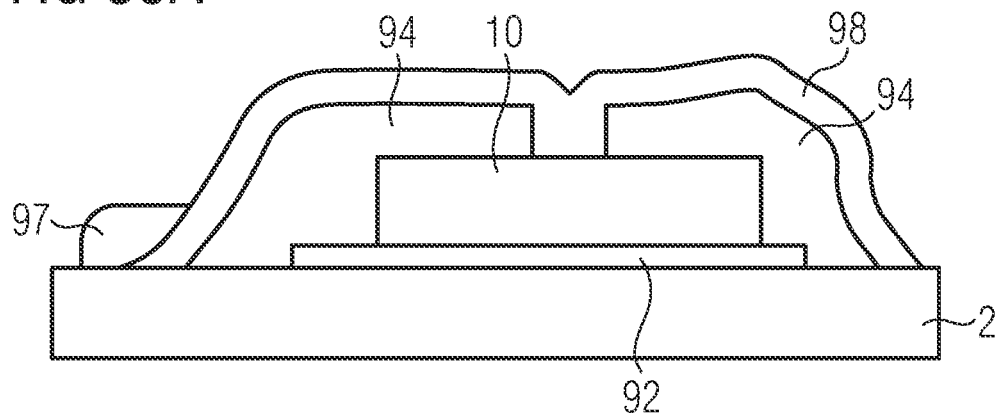
FIGS. 30A to 30C show exemplary embodiments of a semiconductor component.
Figure 30B:
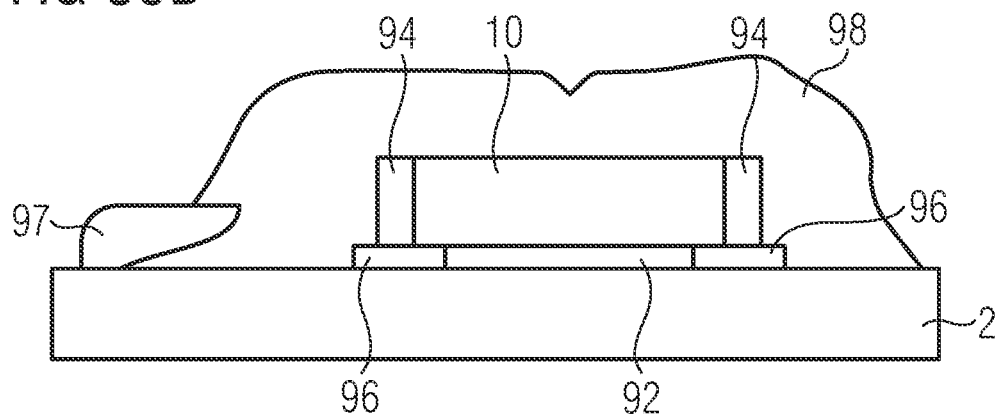
Figure 30C:
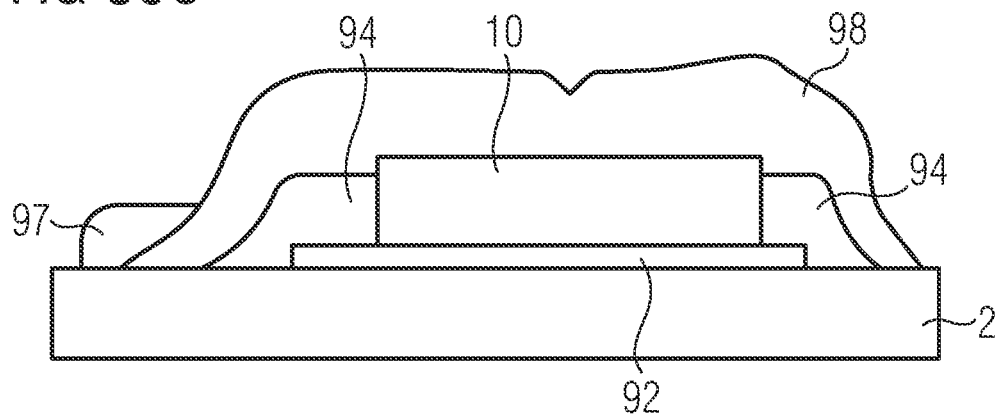

FIGS. 30A, 30B and 30C show exemplary embodiments in which chip contacts are fashioned flexibly and in a planar manner after chip placement as depicted schematically in the figures. The contacts are then likewise "frozen" after deformation and fixed into a shape on both sides in one exemplary embodiment.

The exemplary embodiments illustrated in a planar manner in FIGS. 30A, 30B and 30C comprise a carrier substrate 2, on which conductive structures 92 and an ITO-based semiconductor chip 10 are applied. Insulating structures 94, for example SiO2, are provided at least in lateral regions of the chip 10 and on carrier regions. In the exemplary embodiment in FIG. 30B, an inter-via adhesive 96 is provided between the insulating structures 94 and the carrier 2. In the exemplary embodiments, the chip 10 and the insulating structures 94 are covered by transparent contacts 98, at the side of which an n-type pad 97 is provided. The pad sizes can be in the region of 10 µm, 15 µm, 20 µm or 25 µm and be approximately 10 µm all around the ITO-based chip.

The features of the exemplary embodiments are combinable. The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

REFERENCE SIGNS

2 Carrier
6 Contact means
8 Conductor track
10, 11, 12, 13 Semiconductor chip
16 Wedge
17 Shaping part
18 Wedge-shaped region
19 Domed region
20 Casting
21 Underside
22 Filler
23 Top side
24 Separating line
26 Base side
28 Frame
31, 32, 33 Layer
36 Heat-conducting plinth
38 Metal coating
41, 42, 43, 44, 45, 46, 47 Folding edge 50 Frame
52 Wall
60 Cutout
72, 74 Mold part
77 Membrane
82, 88 Buffer
84 Covering layers
86 Molding foam
92 Conductive structures
94 Insulating structures
96 Inter-via adhesive
74 n-type pad
98 Transparent contact

The invention claimed is:

1. A method for producing a semiconductor component comprising one radiation-emitting optical semiconductor chip or a plurality of radiation-emitting optical semiconductor chips, comprising:
applying the radiation-emitting optical semiconductor chip or the plurality of radiation-emitting optical semiconductor chips on a deformable flat carrier, wherein the deformable flat carrier has a plurality of plated through holes,
deforming the carrier and permanently fixing the deformation, wherein the carrier is deformed by bending or curving by way of a shaping part and the bent or curved carrier is casted in order to fix the deformation,
wherein the shaping part is removed after casting and the resultant cavity is filled or the shaping part remains in the deformed carrier after casting, and
wherein the radiation-emitting optical semiconductor chip or the plurality of radiation-emitting optical semiconductor chips is/are arranged in an angular fashion with respect to a base side of the semiconductor component.

2. The method as claimed in claim 1,
comprising introducing cutouts into the carrier.

3. The method as claimed in claim 1,
wherein a thermoplastic deformation of the carrier is effected, which maintains its deformation after cooling.

4. The method as claimed in claim 1,
wherein the deformation of the carrier is effected by thermoforming by means of compressed air and/or vacuum or by means of a press.

5. The method as claimed in claim 4,
wherein the deformed carrier is encapsulated with a plastics layer.

6. The method as claimed in claim 1,
wherein the semiconductor chip or the plurality of semiconductor chips is/are enclosed by molding on the carrier.

7. The method as claimed in claim 1,
wherein the carrier with the semiconductor chips is singulated to form semiconductor components after the deformation has been fixed.

8. A semiconductor component comprising one radiation-emitting optical semiconductor chip or a plurality of radiation-emitting optical semiconductor chips on a carrier having flexible conductor tracks, which carrier has been permanently deformed after the process of applying the radiation-emitting optical semiconductor chip or the plurality of radiation-emitting optical semiconductor chips, such that the radiation-emitting optical semiconductor chip or the plurality of radiation-emitting optical semiconductor chips is/are arranged in an angular fashion with respect to a base side of the semiconductor component, wherein the carrier has a plurality of plated through holes.

9. The semiconductor component as claimed in claim 8, wherein the carrier comprises a thermoplastically deformed material.

10. The semiconductor component as claimed in claim 8, wherein the carrier has a region which rises above the base side or is recessed from the latter and on which the radiation-emitting optical semiconductor chip or at least one portion of the plurality of radiation-emitting optical semiconductor chips is arranged.

11. The semiconductor component as claimed in claim 10, wherein the region which rises above the base side or is recessed from the latter is arranged on a shaping part.

12. The semiconductor component as claimed in claim 10, wherein the region which rises above the base side or is recessed from the latter is a domed region or has a wedge-shaped or truncated-wedge-shaped cross section.

13. The semiconductor component as claimed in claim 10, wherein the plurality of radiation-emitting optical semiconductor chips are arranged on opposite sides of the region which rises above the base side or is recessed from the latter.

14. The semiconductor component as claimed in claim 8, wherein the carrier has cutouts.

15. The semiconductor component as claimed in claim 8, wherein a first semiconductor chip from the plurality of radiation-emitting optical semiconductor chips is at a first distance from the base side, which first distance is smaller than a second distance between a second semiconductor chip from the plurality of radiation-emitting optical semiconductor chips and the base side.

16. The semiconductor component as claimed in claim 8, wherein a casting on a carrier top side encloses the radiation-emitting optical semiconductor chip or the plurality of radiation-emitting optical semiconductor chips.

17. The semiconductor component as claimed in claim 16, wherein the casting comprises a first material layer, in which there is an active region of a semiconductor chip from the plurality of radiation-emitting optical semiconductor chips, and a second material layer, in which there is an active region of a further semiconductor chip from the plurality of radiation-emitting optical semiconductor chips.

18. The semiconductor component as claimed in claim 8, wherein one or more heat-dissipating regions are arranged in the carrier below the radiation-emitting optical semiconductor chip or the plurality of radiation-emitting optical semiconductor chips.

* * * * *